(12) United States Patent
Baumgartner et al.

(10) Patent No.: US 9,922,153 B2
(45) Date of Patent: Mar. 20, 2018

(54) SCALABLE LOGIC VERIFICATION BY IDENTIFYING UNATE PRIMARY INPUTS

(71) Applicant: International Business Machines Corporation, Armonk, NY (US)

(72) Inventors: Jason R. Baumgartner, Austin, TX (US); Raj K. Gajavelly, Warangal (IN); Alexander Ivrii, Haifa (IL); Pradeep K. Nalla, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 18 days.

(21) Appl. No.: 15/145,406

(22) Filed: May 3, 2016

(65) Prior Publication Data
US 2017/0323043 A1    Nov. 9, 2017

(51) Int. Cl.
*G06F 17/00*   (2006.01)
*G06F 17/50*   (2006.01)

(52) U.S. Cl.
CPC ................. *G06F 17/5045* (2013.01)

(58) Field of Classification Search
USPC ........................................................ 716/107
See application file for complete search history.

(56) References Cited

U.S. PATENT DOCUMENTS

| | | | |
|---|---|---|---|
| 7,624,363 B2 | 11/2009 | Baumgartner et al. | |
| 8,015,523 B2 | 9/2011 | Baumgartner et al. | |
| 8,473,882 B2 | 6/2013 | Baumgartner et al. | |
| 8,990,746 B1 | 3/2015 | Goyal et al. | |
| 2006/0248482 A1* | 11/2006 | Baumgartner ...... | G06F 17/5045 716/104 |
| 2008/0104558 A1* | 5/2008 | Baumgartner ...... | G06F 17/5045 716/103 |
| 2010/0251197 A1* | 9/2010 | Baumgartner ...... | G06F 17/5022 716/108 |
| 2010/0269077 A1* | 10/2010 | Baumgartner ........ | G06F 17/504 716/106 |
| 2011/0208501 A1 | 8/2011 | Yeolekar et al. | |

(Continued)

OTHER PUBLICATIONS

Mukherjee, R., Kroening, D., & Melham, T. (2015). Hardware verification using software analyzers. VLSI (ISVLSI), 2015 IEEE Computer Society Annual Symposium, 7-12.

(Continued)

*Primary Examiner* — Mohammed Alam
(74) *Attorney, Agent, or Firm* — Patterson + Sheridan, LLP

(57) ABSTRACT

Embodiments herein describe a verification process that identifies unate primary inputs in input paths of a property gate. A property gate is logic inserted in a hardware design represented by a netlist which is used to verify the design. Before performing the verification process, a computing system evaluates the netlist to identify the primary inputs in the input paths of the property gate and whether these primary inputs are unate or binate. To do so, in one embodiment, the computing system sets the output of the property gate in an error state and then traverses the input paths of the property gate to identify the values of the logic in the inputs paths that would result in the property gate being in the error state. Based on these polarities, the system can identify the unate and binate primary inputs.

17 Claims, 6 Drawing Sheets

(56) References Cited

U.S. PATENT DOCUMENTS

2014/0330758 A1  11/2014  Yu

OTHER PUBLICATIONS

Cheremisinova, L. D. (2013). SAT-based approaches to verification of logical descriptions with functional indeterminacy. Computer Science and Information Technologies (CSIT), 1-10.
Disclosed anonymously (2014). Automated reduced netlist for efficiency gains, IPCOM000238383D.
David, et al.: "A Computing Procedure for Quantification Theory". Journal of ACM, vol. 7, No. 3, 1960.

* cited by examiner

SCALABLE LOGIC VERIFICATION BY IDENTIFYING UNATE PRIMARY INPUTS

BACKGROUND

The present invention relates to scaling logic verification, and more specifically, to simplifying a netlist by identifying unate primary inputs.

Contemporary hardware designs are typically complex and include a diversity of different logic such as bit-level control logic, data paths of various types (e.g., including pipeline stages, queues, and RAM) with error identification logic, performance related artifacts (e.g., pipelining, multi-threading, out-of-order execution, and power saving techniques), and pervasive logic artifacts used to initialize the design, monitor its runtime execution, detect and cope with faults. While verifying hardware designs is necessary, the increased complexity of hardware designs has made verification more difficult. As such, techniques which reduce the size of the design being verified can make a large positive impact on the tractability of the verification task. These techniques can reduce the complexity of the logic design thereby reducing the risk of missing design flaws while reducing the time required to complete the design process.

SUMMARY

One embodiment of the present invention is a method that includes identifying a property gate in a netlist, where a state of the property gate is used to verify proper function of the netlist. The method includes traversing input paths corresponding to the property gate to identify first and second primary inputs upstream from the property gate and identifying respective polarities of the first and second primary inputs by assigning polarity values to logic in the input paths that are between the property gate and the first and second primary inputs where the identified polarities are at least one of a positive value and a negative value. The method includes characterizing the first primary input as unate and the second primary input as binate based on the identified polarities and merging the unate primary input to a constant value in the netlist.

Another embodiment of the present invention is a computer program product that includes computer-readable program code executable to perform an operation that includes identifying a property gate in a netlist where a state of the property gate is used to verify proper function of the netlist and traversing input paths corresponding to the property gate to identify first and second primary inputs upstream from the property gate. The operation includes identifying respective polarities of the first and second primary inputs by assigning polarity values to logic in the input paths that are between the property gate and the first and second primary inputs, where the identified polarities are at least one of a positive value and a negative value. The operation includes characterizing the first primary input as unate and the second primary input as binate based on the identified polarities and merging the unate primary input to a constant value in the netlist.

Another embodiment of the present invention is a computing system that includes a computing processor and a memory comprising a program that when executed by the processor is configured to identify a property gate in a netlist, where a state of the property gate is used to verify proper function of the netlist and traverse input paths corresponding to the property gate to identify first and second primary inputs upstream from the property gate. The program is further configured to identify respective polarities of the first and second primary inputs by assigning polarity values to logic in the input paths that are between the property gate and the first and second primary inputs, where the identified polarities are at least one of a positive value and a negative value. The program is configured to characterize the first primary input as unate and the second primary input as binate based on the identified polarities and merge the unate primary input to a constant value in the netlist.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
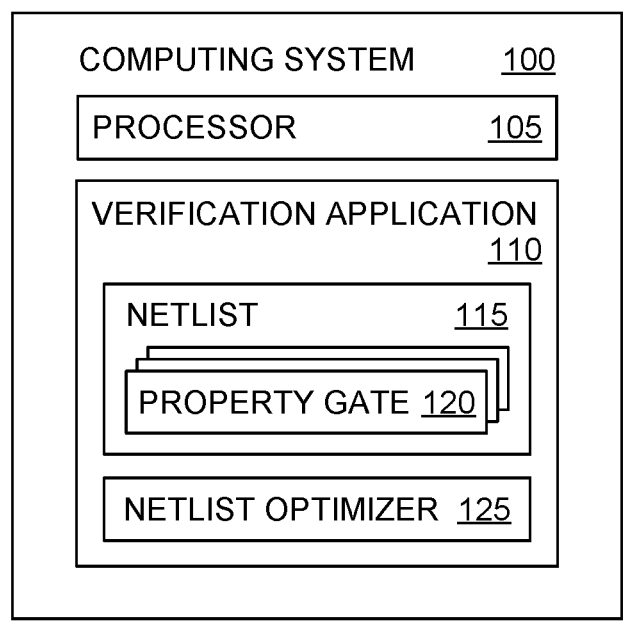
FIG. 1 illustrates a computing system for reducing the size of a netlist being verified, according to one embodiment described herein.

Embodiments herein describe a verification process that identifies unate primary inputs in input paths of a property gate. A property gate is logic inserted in a hardware design represented by a netlist which is used to verify the design. When performing the verification process, the state of the property gate is monitored to ensure the property gate does not enter into an error state. However, before performing the verification process, a computing system evaluates the netlist to identify the primary inputs in the input paths of the property gate and whether the primary inputs are unate or binate. To do so, in one embodiment, the computing system sets the output of the property gate in an error state (e.g., a logical one) and then traverses the input paths of the property gate to identify the output values of the logic in these paths that would result in the property gate being in the error state. Stated differently, when traversing the input paths, the computing system assigns a polarity (e.g., a positive value or a negative value) to the logic in the input paths which causes the property gate to enter into the error state. These inputs paths may include a plurality of logic gates of different types, including combinational gates as well as sequential gates (latches and RAM).

This traversal may continue until the computing system reaches a primary input which is defined herein as logic in the netlist that is treated as nondeterministic by a verification process. Put differently, the output of a primary input is not dependent on any logic upstream of the input, which means the output of the primary input cannot be predicted by monitoring the states of upstream logic (if any). For example, the primary input may be a bus that can float (meaning its state cannot be determined at all times) or input received from a separate or external system or user. Because the output of a primary input is random, this logic may also be referred to as a random gate.

Once a primary input is identified, the computing system assigns a polarity to the input which would cause the property gate to enter into the error state. Moreover, as will be described in detail below, the primary inputs can be assigned both polarities rather than only one polarity. For example, when traversing through a first input path, the computing system may determine the primary input should be assigned a negative polarity. However, when traversing through a second input path, the computing system assigns a positive polarity to the same primary input. After traversing the input paths of the property gate, primary inputs assigned only one of the polarities (i.e., either the negative value or the positive value) are characterized as unate primary inputs. In contrast, primary inputs assigned both polarities are characterized as binate primary inputs. In one embodiment, the computing system can assign the unate primary inputs (i.e., the inputs that are assigned only one of the two polarities) as constant values. Put differently, the computing system can merge the unate primary inputs (as well as the corresponding upstream or fan-in circuitry of the property gate) to a constant value in the netlist. Because unate primary inputs have only one output path that can cause the property gate to enter into a desired state, the logic of these primary inputs can be reduced to a constant value when performing the verification process. Stated differently, the embodiments herein can identify inputs which need never be given a definitive value to produce a possible fail in the property gate, and thus can be reduced to a constant value. Doing so may reduce or remove portions of the netlist thereby reducing the time required to perform the verification process.

In another embodiment, identifying the unate inputs to a property gate is used to decompose the property gate into individual inputs. In this embodiment, a computing system generates a sum-of-products (SOP) representation of the inputs into the property gate. The computing system evaluates the different clauses in the SOP representation to determine if decomposing the clauses would increase the number of unate inputs of the property gate. For example, the inputs in one of the clauses in the SOP representation may be binate, but if this clause was decomposed, the resulting inputs may be unate. As stated above, the unate inputs can be merged to constant values thereby reducing the complexity of the netlist. In this manner, identifying unate inputs can be used to selectively determine whether to decompose clauses in a SOP representation of a property gate.

FIG. 1 illustrates a computing system 100 for reducing the size of a netlist 115 being verified, according to one embodiment described herein. The computing system 100 includes a processor 105 and a verification application 110. The processor 105 represents one or more processing elements that each may include multiple processing cores. Using the processor 105, the verification application 110 can evaluate the netlist 115 to identify unate primary inputs for property gates 120 which can then be merged to constant values. Specifically, the verification application 110 includes a netlist optimizer 125 which traverses the input paths of each of the property gates 120 in the netlist 115 to identify unate and binate primary inputs. As described in more detail below, the unate primary inputs have only one state that can cause the property gates 120 to enter into a desired state. Thus, instead of the verification application 110 having to evaluate the logic of the primary inputs (and their fan-ins), this logic can be reduced to a constant value when verifying the design represented by the netlist 115.

Although the embodiments herein describe the netlist 115 as detailing a design for a hardware component (e.g., a processor, ASIC, memory unit, floating point unit, etc.), the techniques described herein may also be used to verify software applications. In one embodiment, the netlist 115 includes a directed graph with vertices representing gates and edges representing interconnections between those gates. The gates have corresponding functions such as constants, primary inputs, combinational logic (e.g., AND or OR gates), and the like. Moreover, in one embodiment, the netlist 115 is a sequential netlist (i.e., a state-saving netlist) that includes sequential hardware elements (i.e., latches and registers) and/or memory arrays.

The property gates 120 are special gates in the netlist 115 used for testing a verification objective of the application 110. When verifying the netlist 115, the verification application 110 monitors the state of the property gates 120 (e.g., the logical outputs of the gates 120) to determine if they enter an error state. If so, the verification application 110 knows a verification objective failed. In one embodiment, the verification application 110 uses a plurality of different input sequences to determine if any of these sequences place one of the property gates 120 in the error state. If so, the design may have an error which can be identified and fixed by a system developer. When a verification failure is detected illustrating an error state of a property, it is generally desired to produce a counterexample trace—or waveform showing valuations to the gates of the netlist over time—starting from an initial state and ending in one illustrating an error state of a property gate.

In one embodiment, there are two types of property gates 120: a safety property and a liveness property. A gate labeled as a safety property represents a verification objective where the goal is to find a trace showing the property gate 120 entered an error state, or to prove that the property gate cannot ever enter into the error state. For example, if the error state of the safety property gate is a logical one, the verification application 110 confirms for the system developer that no input sequence can cause the gate to output a logical one. The liveness property is used to ensure the design does not enter into a deadlock state where, for example, the gate enters into a certain state and then remains in the state regardless of changing inputs. The techniques described herein may be used to simplify the fan-in logic for either type of property gate 120.

In yet another embodiment, there may be an additional type of special gate for verification called a "constraint." A constraint restricts the behaviors that are to be explored during verification: every constraint gate must remain asserted (evaluating to a logical "1") for the duration of any produced counterexample trace. In one embodiment, the proposed reduction technique operates by treating constraint gates as yet another type of property gate.

Figure 2:
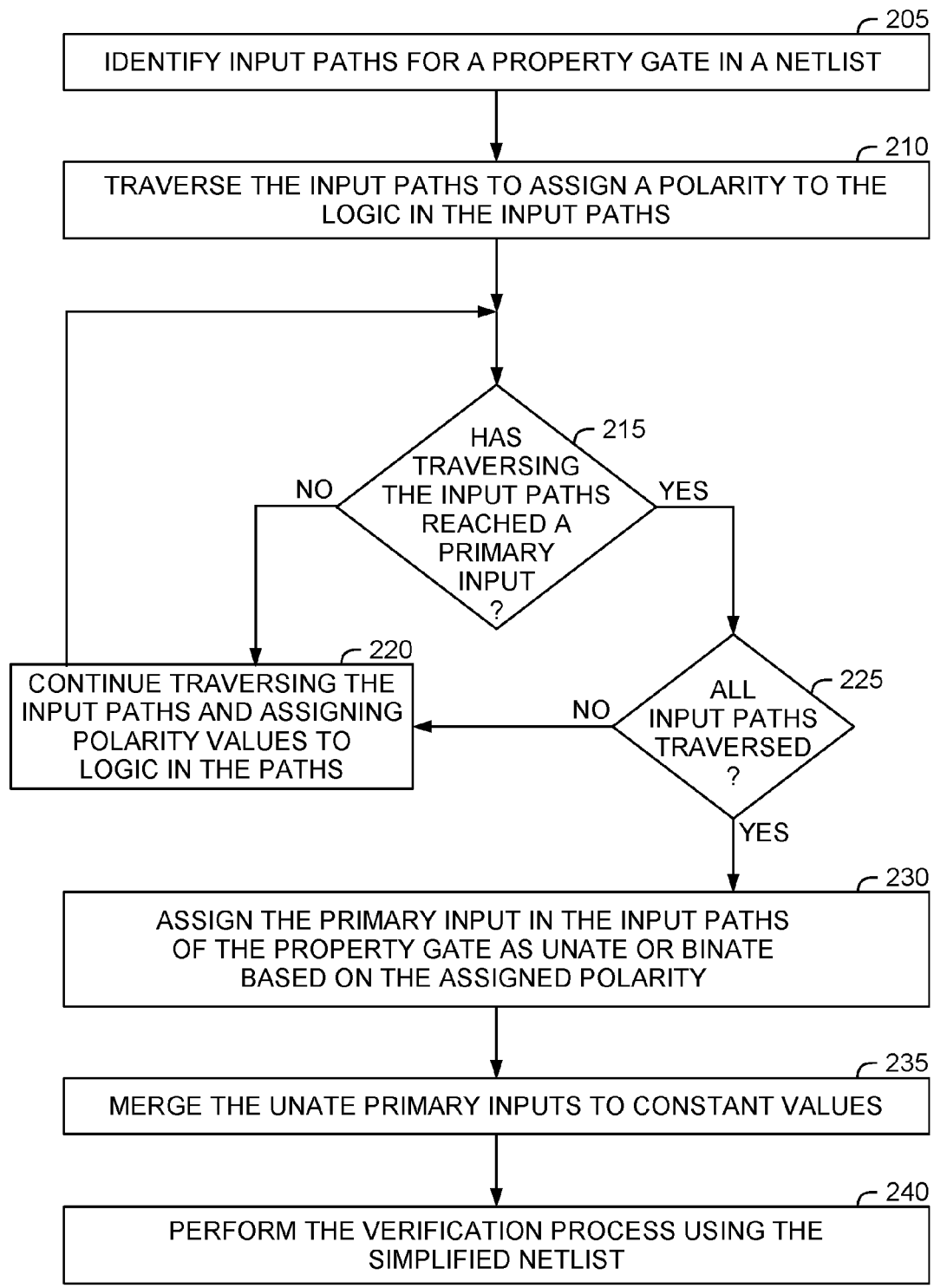
FIG. 2 is a flow chart for identifying unate primary inputs affecting a property gate, according to one embodiment described herein.

FIG. 2 is a flow chart for method 200 that identifies unate primary inputs affecting a property gate, according to one embodiment described herein. At block 205, the netlist optimizer identifies input paths for a property gate in the netlist. The logic of the property gate may be a simple logical AND or OR gate, or more complex logic that includes a combination of logical gates. The input paths include the gates (i.e., logic) in the fan-in of the property gate. Stated differently, the input paths include the logic in the netlist that determine the input values provided to the property gate.

Figure 3B:
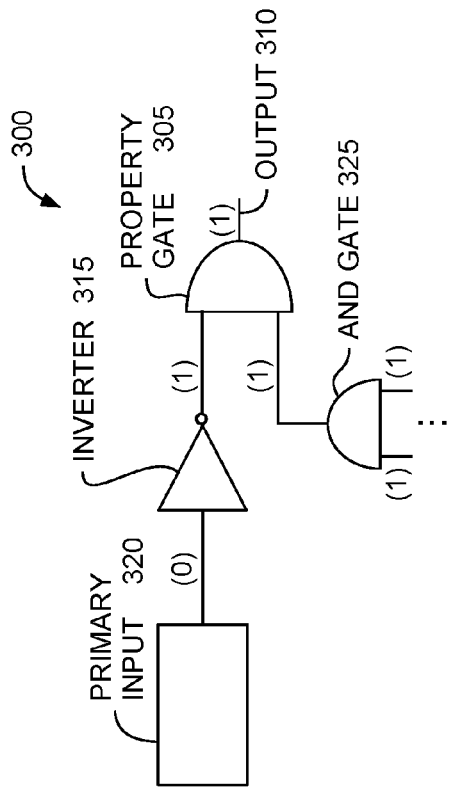
FIGS. 3A and 3B illustrate a circuit design including an unate primary input, according to one embodiment described herein.
Figure 3A:
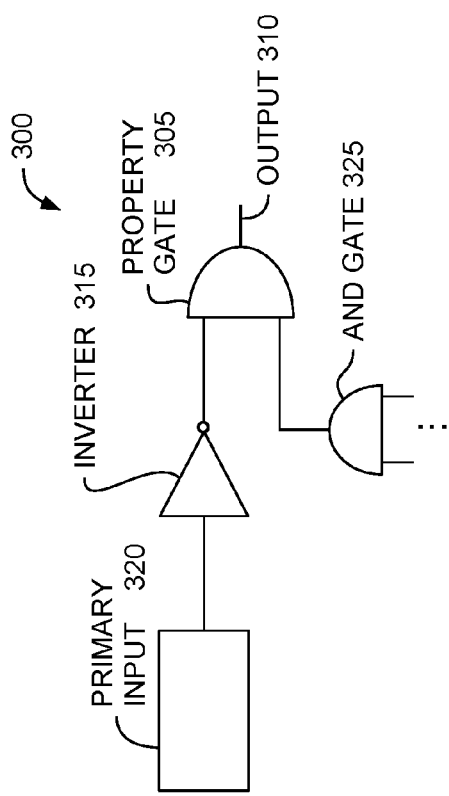

FIGS. 3A and 3B illustrate a circuit design 300 that illustrates the input paths of a property gate 305. Specifically, the circuit design 300 provides one example of a circuit that may be represented by a netlist. As shown, the property gate 305 includes two inputs which determine the output 310 of the property gate 305 (shown here as an AND gate). The top input is coupled to an inverter 315 and a primary input 320. The bottom input is coupled to another AND gate 325 which may be coupled to additional fan-in circuitry (not shown).

Returning to block 210 of method 200, the netlist optimizer traverses the input paths to assign a polarity to the logic in the input paths. For example, the property gate 305 in FIG. 3A includes two inputs which mark the beginning of the input paths. However, before beginning to traverse the inputs paths, the netlist optimizer sets the output 310 of the property gate 305 in an error state. This is shown in FIG. 3B where the value of the output 310 of property gate 305 is a logical one (1). Once the output 310 of the property gate 305 is in the error state, the netlist optimizer traverses the input paths, moving upstream from the typical flow of data. As the netlist optimizer reaches logic in the input paths, the optimizer signs a polarity to that logic according to what output value of the logic results in the property gate 305 being in the error state—i.e., outputting a logical one. In this case, because the property gate 305 is an AND gate, if both of its inputs are a logical one, this results in a logical one at the output 310—i.e., the error state. Thus, the netlist optimizer labels the inputs of the property gate 305 as logical ones (1)—i.e., the positive polarity value.

Moving upstream on the top input path, the netlist optimizer encounters the inverter 315. Because a logical zero at the input of the inverter 315 results in a logical one at its output, the netlist optimizer labels the input of the inverter 315 as a logical zero (0)—i.e., the negative polarity value. That is, in order for the property gate 305 to be in the error state, the input of the inverter 315 must be at the negative polarity value. Similarly, the output of the primary input 320 must be a logical zero for the property gate 305 to be in the error state. Stated oppositely, if the primary input 320 outputted a logical one, the output 310 of the property gate 305 would be a logical zero—resulting in a non-error state regardless of other valuations in the netlist (e.g., from AND gate 325). Because verification is performed to determine what input sequences cause the property gate 305 to enter into the error state, input sequences that switch the property gate 305 to a non-error state—i.e., output a logical zero—may not be of interest.

The netlist optimizer then traverses the lower input path. Again, the output 310 is placed in the error state only if the lower input of the property gate 305 is a logical one. Thus, the polarity of the AND gate 325 is a positive polarity. To achieve a logical one as an output, the inputs of the AND gates 325 must also be logical ones thereby assigning the polarity of the circuit elements driving these inputs to the positive polarity.

At block 215 of method 200, the netlist optimizer determines whether traversing the input paths has reached a primary input. At block 220, the netlist optimizer continues to traverse the input paths and assigning polarity values to the logic in the paths until the optimizer reaches a primary input. As defined above, the primary input represents logic in the netlist whose output is treated as nondeterministic (e.g., random) during verification. State differently, the output of a primary input is not determined solely by its inputs because a primary input has no inputs in a netlist. Examples of primary inputs include input from a different or external system, components that can float electrically, and other undetermined netlist behavior such as bus collisions (driving 0 and 1 concurrently to a given signal), reads to a RAM which are to undefined addresses, and don't care conditions from source Hardware Description Language ('X' values). As shown in FIG. 3B, the primary input 320 is assigned a negative polarity since the primary input 320 needs to output a logical zero in order to cause the property gate 305 to switch into the error state. The netlist optimizer also traverses the lower input until reaching a primary input in that input path (not shown in FIG. 3B). In this manner, the primary inputs (as well as the logic between the primary inputs and the inputs to the property gate) are assigned a polarity value.

Although circuit design 300 illustrates the upper input path as having only one primary input 320, an input path may have several primary inputs. For example, the two inputs on the AND gate 325 may be coupled to two different primary inputs. These primary inputs would both be assigned the positive polarity values.

Returning to method 200, at block 225, the netlist optimizer determines whether all the input paths for the property gate have been traversed and whether the logic in these paths has been assigned a polarity. If so, method 200 moves to block 230 where the netlist optimizer characterizes the primary inputs in the input paths of the property gate as unate or binate based on the assigned polarity. An unate primary input is any input that is assigned only one of the two priority values. That is, an unate primary input is assigned either the negative polarity value (i.e., 0) or the positive polarity value (i.e., 1), but not both. The primary input 320 in FIG. 3B is an unate primary input since the input 320 is assigned only the negative polarity value.

In one embodiment, a primary input may be evaluated multiple times by the netlist optimizer and still be characterized as an unate primary input. For example, assume that the circuit design 300 in FIG. 3A was changed such that the output of the inverter 315 was one of the inputs to the AND gate 325. Because the output of the primary input 320 affects both the top and bottom input paths of the property gate 305, the netlist optimizer may assign a polarity to the primary input 320 when traversing both of these input paths. However, because the primary input 320 would be assigned the same negative polarity value each time, the netlist optimizer characterizes the primary input 320 as an unate primary input.

Figure 4B:
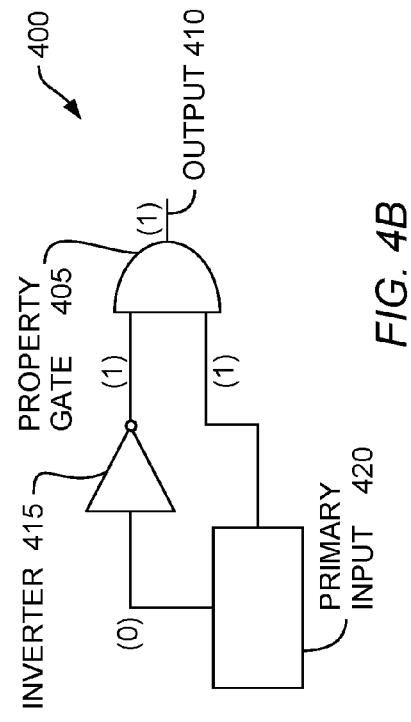
FIGS. 4A and 4B illustrate a circuit design that includes a binate primary input, according to one embodiment described herein.
Figure 4A:
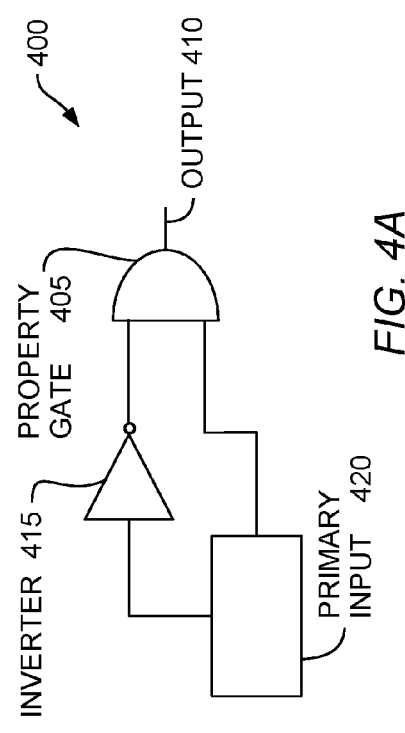

FIGS. 4A and 4B, however, illustrate a circuit design 400 that includes a binate primary input. In circuit design 400, a property gate 405 has an output 410 controlled by two input paths. The top input path includes an inverter 415 which is coupled to a primary input 420. The lower input path is coupled directly to the primary input 420.

FIG. 4B illustrates performing blocks 205-225 to assign polarity values to the logic in the input paths. As stated above, the netlist optimizer sets the output 410 of the property gate 405 to the error state (i.e., a logical one) and then determines the values of the inputs to the property gate 405 which would result in the error state. Because the property gate 405 is an AND gate, both inputs must be a logical one (e.g., the positive polarity) to cause the output 410 to be in the error state.

Traversing upstream along the top input path, the input of the inverter 415 must be a logical zero—i.e., the negative polarity—to cause the property gate 405 to switch to the error state. Because the output of the primary input 420 must be a logical zero, the primary input 420 is assigned the negative polarity. However, when traversing the lower input path of the property gate 405, the output of the primary input 420 must be a logical one—i.e., the positive polarity—to cause the property gate 405 to switch to the error state. Thus, after traversing the input paths, the primary input 420 is assigned both polarity values—i.e., both the negative and positive values. As such, at block 230, the netlist optimizer characterizes the primary input 420 as a binate primary input. This characterization means that outputting either a logical one or a logical zero from the primary input 420 can cause the property gate 405 to enter into the error state.

At block 235, the netlist optimizer merges the unate primary inputs to constant values in the netlist. Put differently, the logic representing the primary inputs in the netlist can be replaced by a constant value—i.e., a logical one or zero. By identifying the unate primary sources, the netlist optimizer identifies input sequences that cannot cause the property gates to switch to the error state. For example, because the primary input 320 is unate, only one of the two polarity values can cause the output 310 of the property gate 305 to switch into the error state. Thus, because only the negative polarity can cause the primary input 320 to switch the property gate 305 into the error state, any input sequence that outputs a positive polarity from the primary input 320 can be ignored. As a result, the primary input 320 can be merged into a constant value—i.e., the negative polarity—thereby eliminating its corresponding logic from the netlist. In addition to eliminating the unate primary inputs, the logic coupled to the unate primary inputs may also be eliminated from the netlist, thereby further reducing the complexity of the netlist.

Although the primary inputs 320 and 420 in FIGS. 3A, 3B, 4A, and 4B are shown abstractly as generic boxes, these inputs may include complex circuitry. Simplifying this circuitry in the netlist means that the verification application no longer has to expend resources to evaluate the outputs of the unate primary inputs. Instead, their outputs are maintained as a constant value. For example, the logic of the primary input 320 can be simplified to a constant logical zero being fed into the inverter 315.

In one embodiment, however, the binate primary inputs are not removed from the netlist. Because outputting either a logical one or logical zero from the binate primary input can potentially cause the property gate to enter into the error state, the netlist optimizer leaves the logic of the primary inputs labeled binate in the netlist. That is, to verify the function of the netlist, the verification application may need to evaluate different valuations to the logic coupled to the binate primary inputs when performing the verification process. As such, in this embodiment, the netlist optimizer identifies and merges the unate primary inputs but ignores the binate primary inputs.

In one embodiment, in addition to identifying the unate primary inputs, the netlist optimizer identifies "do not care" primary inputs whose outputs do not affect any of the property gates. That is, the netlist may include primary inputs whose outputs are not in an input path for any of the property gates in the netlist. As such, the outputs of the do not care primary inputs cannot change the state of the property gates. To identify the do not care primary inputs, the netlist optimizer may scan through the netlist to identify primary inputs that have not being assigned any polarity values performing blocks 205-230 of method 200. The netlist optimizer labels these unassigned primary inputs as do not care primary inputs. Like the unate primary inputs, the netlist optimizer can merge the logic of the do not care primary inputs to a constant value (e.g., a logical zero) thereby further reducing the size and complexity of the netlist.

There may be a variety of combinational gate types in a netlist representation. Inverters are 1-input 1-output gates as discussed and when assigning a polarity to the output of an inverter, the opposite polarity is assigned to its input. Buffers are also 1-input 1-output gates and when assigning a polarity to the output of a buffer, the same polarity is assigned to its input. AND and OR gates are n-input 1-output gates and when assigning a polarity to the output of an AND or OR gate, the same polarity is assigned to its inputs. NAND and NOR gates are n-input 1-output gates and when assigning a polarity to the output of an AND or OR gate, the opposite polarity is assigned to its inputs. XOR (exclusive OR) and XNOR (exclusive NOR) gates are n-input 1-output gates whose inputs may always be marked in both polarities when traversed. Multiplexors are N-input port data routing structures, driving their output data vector with the data appearing at the N'th input data port, controlled by a "selector" input which defines N. When assigning polarities to a multiplexor, the value assigned to a data output is also assigned to all corresponding data inputs, although selector pins must be assigned both polarities. Arithmetic gates (adders, multipliers, etc.) generally have their inputs marked in both polarities. It is possible to synthesize the function of any other gate type in terms of the above constructs; the polarity assignment follows from that of the corresponding synthesis into these primitives.

Latches and registers are common sequential hardware design components in a sequential netlist, which are able to hold data values—unlike combinational gates which produce new output values when their inputs change. Latches and registers generally have one or more data input vectors, each associated with a clock. When the clock exhibits a specifiable behavior (e.g., transition from logical 0 to 1), the data-input vector is propagated to the data-output and held until another such clock event. Latches and registers may also have asynchronous "reset" inputs which change their value to constants and may have port precedence defined across multiple data-input vectors where one data-input vector may mask the value of another. When assigning polarities of a latch or register, the same polarity being assigned to a data output is assigned to all corresponding data inputs. However, reset and clock pins are assigned in both polarities.

RAM (memory arrays) are common sequential hardware design components in a sequential netlist, representing two-dimensional grids of state-holding elements arranged as addressable "rows" of a predetermined data "width." The netlist representation of RAM can be significantly more complex than that of other gates. RAM has a sequence of "read" and "write" ports, composed of three components: an "enable" indicating whether a read or write is concurrently active, an "address" vector defining which row is being accessed, and a "data" vector indicating other netlist signals whose values will define new data written to the row, or which other netlist signals are to be driven by the data values being read. When assigning polarity through a RAM, in one embodiment the polarity being marked is propagated to a read data port (an output of the RAM) to all of the write data inputs of the RAM whose read data port is being traversed. Enable and address pins can be marked in both polarities when traversing a read data port, not only to the read port being traversed, but also all of the write ports associated with the RAM. In one embodiment, one advantage of using the techniques described herein over attempting to derive reducible inputs, e.g., from unit clauses of a Boolean satisfiability (SAT) solver is that these solvers rely on converting a sequential design component (e.g., latches, registers, RAM, etc.) into combinational logic to model a fixed temporal duration of netlist behavior, but this logic cannot be model all periods in time. In contrast, the embodiments here can be used to reduce sequential netlists that include sequential design components.

At block 240, the verification application performs the verification process using the simplified netlist. Specifically, the logic in the unate (and do not care) primary inputs are represented by constant values in the netlist which reduces the amount of hardware that is evaluated during the verification process. Stated differently, the verification application no longer has to explore different valuations to the logic coupled to the unate primary inputs to determine the output of these inputs when performing the verification process. As a result, identifying and merging the unate primary inputs can result in the verification process being completed in less time relative to performing the verification process on the original netlist.

If the verification application detects that one of the property gates enters into the error state during the verification process, the application may prepare a waveform trace to help a system developer to identify and correct any bug or flaw in the design. In one embodiment, the merged primary inputs are also represented in the trace. That is, the trace includes the constant values used to represent the unate (and do not care) primary inputs in the netlist. In one embodiment, a minimally-assigned waveform is produced in response to a failed verification run, i.e., including as few primary input values as possible. This minimization can help to reduce manual debug effort to understand what is relevant in the counterexample waveform. The inputs merged due to unateness can be added to such waveforms to ensure that the waveform exhibits a property failure and excluding the merged inputs may render an invalid counterexample.

In one embodiment, scaling the verification process using method 200 can be applied to other transformation techniques. For example, some transformation techniques decompose the verification process into multiple smaller verification processes. Identifying the unate primary inputs after decomposing the verification process may enable the small processes to be further simplified. In another example, one or more transformations techniques may be performed on the netlist before method 200 is used to identify and merge the unate primary inputs in the netlist to constant values. The verification application may again perform the same transformations on the netlist modified using method 200 to further simplify the verification process. In this manner, method 200 may be combined with other transformation techniques to improve the resources and coverage of the verification process.

Figure 5:
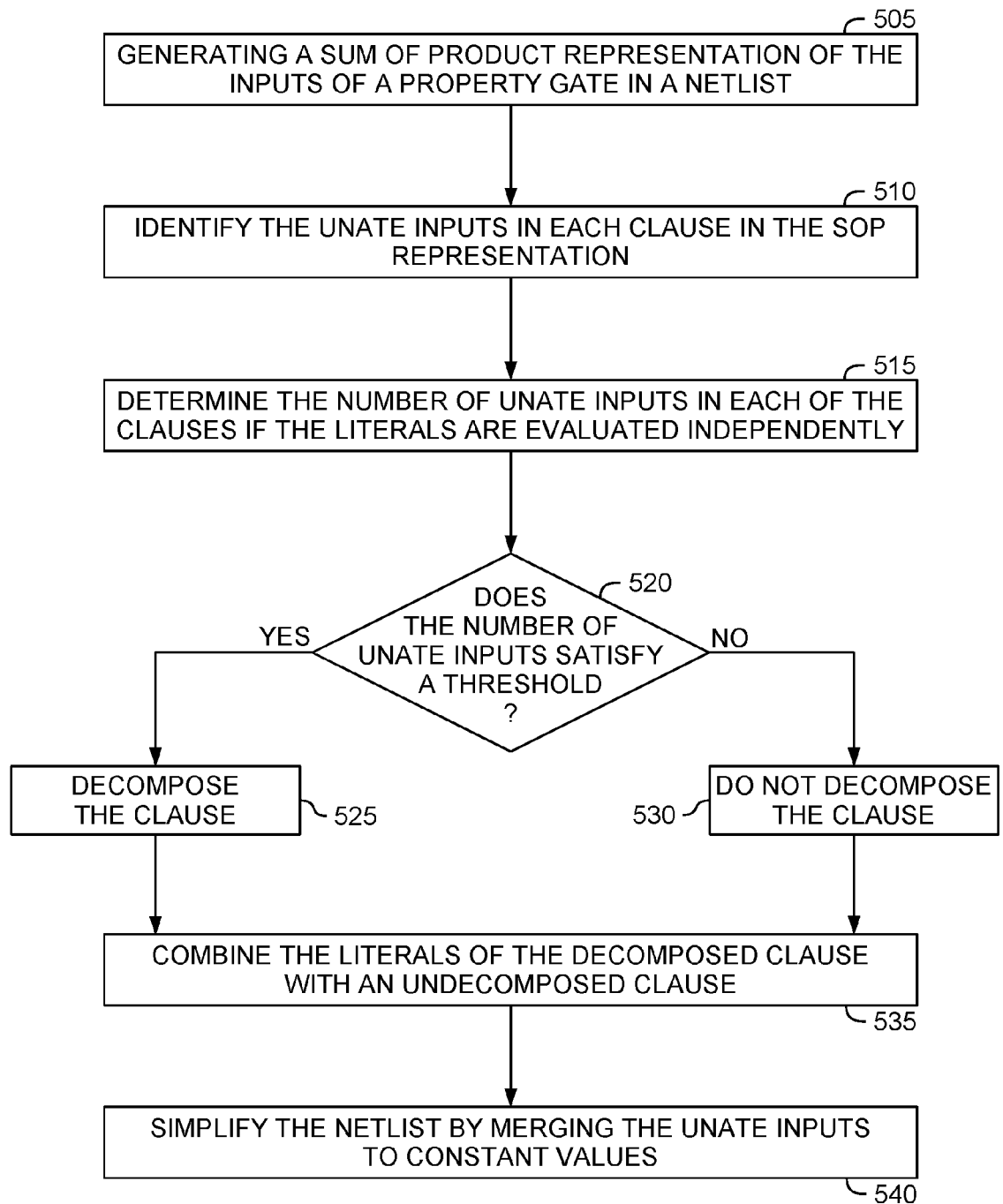
FIG. 5 is a flow chart for decomposing a sum of product representation of a property gate, according to one embodiment described herein.
Figure 6A:
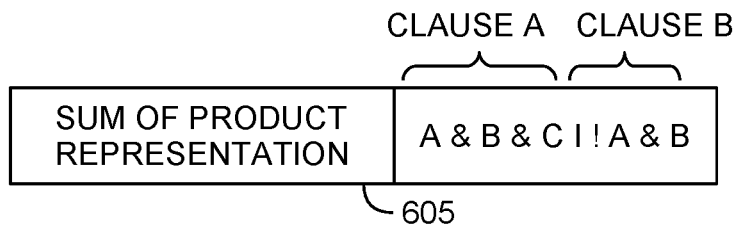
FIGS. 6A-6C illustrate decomposing a sum of product representation of a property gate, according to one embodiment described herein.

FIG. 5 is a flow chart of an exemplary transformation method 500 for decomposing a sum of product (SOP) representation of a property gate using unate inputs. At block 505, the netlist optimizer generates a SOP representation of the inputs of a property gate in the netlist. FIG. 6A illustrates an exemplary SOP representation of a property gate. In chart 605, the SOP representation includes inputs from Gates A, B, C, and D that each provides an input to the property gate. The SOP representation in chart 605 can be logically divided into two clauses: Clause A and Clause B which are separated by the logical OR operator. The embodiments herein are not limited at any particular method of generating the SOP representations, and any technique for generating the SOP representation of the output of the property gate can be used.

Returning to method 500, at block 510, the netlist optimizer identifies the unate inputs in each of the clauses. For example, in the SOP representation shown in chart 605, the netlist optimizer determines how many unate inputs are in Clause A and how many unate inputs are in Clause B. To do so, the netlist optimizer may perform a similar technique to method 200 by traversing the inputs to identify the logic that is assigned only one of the two polarity values. This logic is then labeled as an unate input. In one embodiment, the netlist optimizer also determines the number of binate and do not care inputs in each clause in the SOP representation.

At block 515, the netlist optimizer determines the number of unate inputs in each of the clauses if the literals in the clauses are evaluated independently of each other. As used herein, a literal is a particular gate in a clause—e.g., Gate A, B, C, or D. In one embodiment, the netlist optimizer evaluates only the literals in the clauses that were identified as binate at block 510. For example, if Gate A in Clause A is binate at block 510, at block 515, the netlist optimizer determines if considering Gate A independently of the other literals in Clause A changes Gate A to a unate input. The netlist optimizer may perform the same calculation for all the binate literals identified at block 510 to determine if considering the literals independently changes them to unate literals. The netlist optimizer can identify how many of the binate inputs in each clause would be changed to unate inputs if the literals in the clause were considered independently.

Figure 7A:
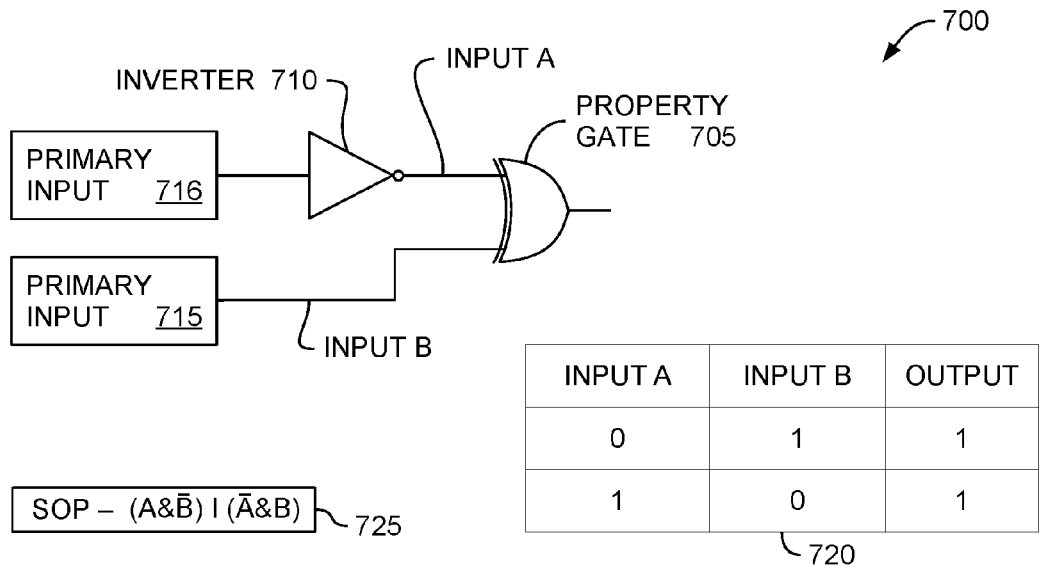
FIGS. 7A and 7B illustrate decomposing the inputs of a property gate, according to one embodiment described herein.
Figure 7B:
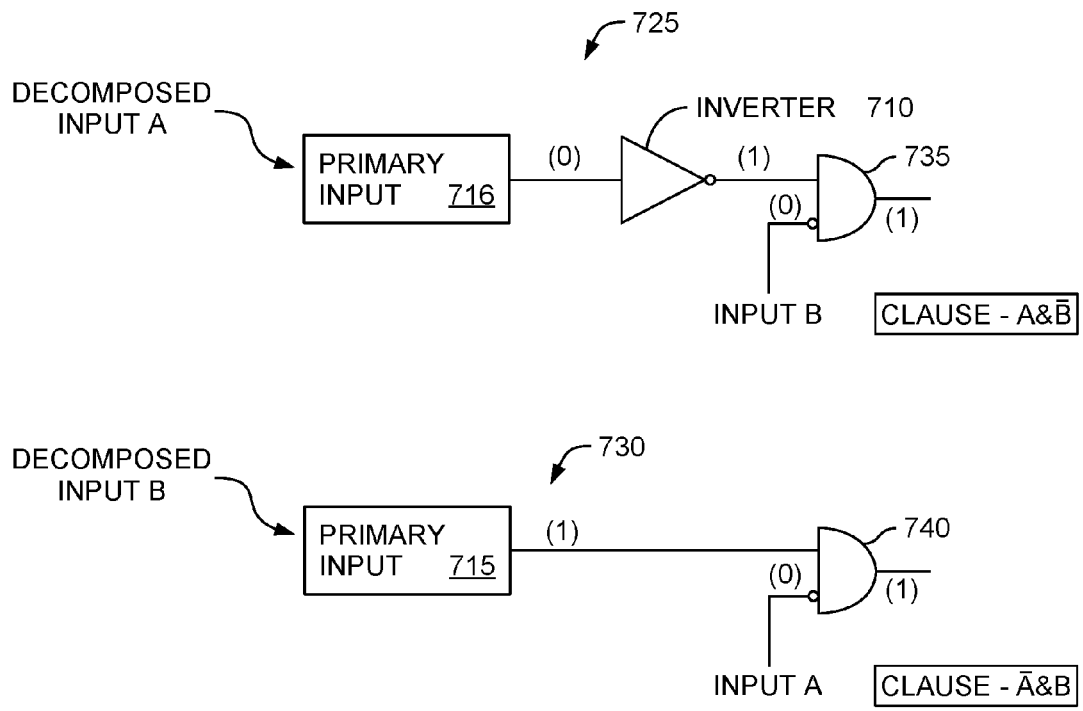

FIGS. 7A and 7B illustrate decomposing the inputs of a property gate to determine if doing so results in a binate input of the property gate converting into an unate input. Specifically, FIGS. 7A and 7B illustrate an example where inputs for a clause in SOP representation are binate when considered as a whole but unate when decomposed and considered individually. FIG. 7A illustrates a circuit design 700 with a property gate 705 that performs OR logic to generate an output. The property gate 705 includes two inputs: Input A and Input B. Moreover, the top input path into the property gate 705 includes an inverter 710 and a primary input 715 while the bottom input path includes a direct connection to the primary input 715.

The SOP representation of the inputs of the property gate 705 is provided in chart 720. As shown, the output of the property gate 705 is the result of performing an XOR function using Input A (i.e., the output of inverter 710) and Input B (i.e., the output of the primary input 715). Input A is further determined by primary input 716 (which is coupled to inverter 710) while Input B is determined by the output of primary input 715. The values of the Inputs A and B which cause the property gate 705 to enter into the error state (i.e., output a logical one) are provided in chart 720. Unlike in FIGS. 3B and 4B where only one polarity of the inputs to the property gates would cause the property gates to enter into the error state, both the negative and the positive polarity at the inputs of property gate 705 results in the error state. Furthermore, both inputs of property gate 705 are required to be in a correlation of opposite values to contribute to an error state. This requires that polarity assignment mark every input to an XOR gate as binate during traversal. Thus, the inputs in the SOP representation in chart 720 are binate. That is, when performing block 510 of method 500, the netlist optimizer would determine that these inputs are binate instead of unate.

However, FIG. 7B illustrates decomposing the inputs A and B (i.e., the literals in the SOP representation) such that the SOP representation 725 is broken up into two separate clauses. Circuit design 725 illustrates the first clause of the SOP representation 725 which includes primary input 716, inverter 710, and AND gate 735. Circuit design 730 illustrates the second clause of the SOP representation 725 which includes primary input 715 and AND gate 740. As shown, Inputs A and B are assigned only one polarity which means these inputs in the two clauses are now unate. Thus, when performing block 515 or method 500, the netlist optimizer determines that decomposing the literals in the clauses of the SOP representation would change the binate inputs to unate inputs.

In another embodiment, if the SOP representation was instead (A & B) (!A & C) where B contain unate variables but C does not, the netlist optimizer would choose to decompose the literals in clause (!A & C) rather than clause (A & B).

At block 520 of method 500, the netlist optimizer determines if the number of binate inputs that would become unate inputs if the clause were decomposed satisfies a threshold. For example, the netlist optimizer may determine if decomposing the clause would result in at least 50% of the binate inputs converting to unate inputs. Alternatively, the netlist optimizer may decompose a clause if at least one binate input would be changed to an unate input.

In one embodiment, the netlist optimizer ranks the different clauses using the number of binate inputs converted into unate inputs during decomposition. For example, the netlist optimizer may determine the number of decomposed unate inputs in each clause that do not appear as binate inputs in any of the other clauses in the SOP representation. The optimizer can then rank the clauses based on the number of decomposed unate inputs that are unique to each clause. In another embodiment, the netlist optimizer may rank the different clauses by determining whether the decomposed unate inputs in each clause are also not decomposed unate inputs for other clauses in the SOP representation. For example, the clause with the most unique decomposed unate inputs relative to the other clauses may receive the highest rank. The netlist optimizer may rank the clauses using one of these ranking schemes or both of the ranking schemes. The netlist optimizer can then choose the highest ranked clause or clauses for decomposition. That is, the netlist optimizer can use the predefined threshold during block 520 of method 500 to evaluate the rankings and select which clause to decompose.

Figure 6B:
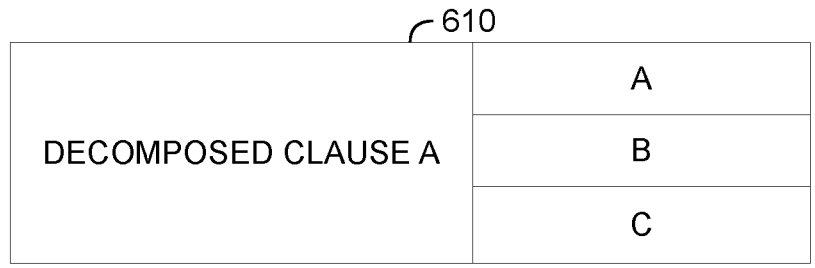

At block 525, the netlist optimizer decomposes the clause (or clauses) selected using the criteria described above. FIG. 6B illustrates decomposing Clause A of the SOP representation 605. For example, the netlist optimizer may have determined, by ranking the clauses in representation 605, that Clause A should be decomposed. As shown in chart 610, each literal in Clause A (i.e., Gate A, B, and C) are separated into individual inputs. As shown in FIGS. 7A and 7B, doing so may change some, or all, of the inputs from binate to unate.

At block 530, the netlist optimizer identifies the clauses in the SOP representation that are not decomposed. These clauses may not have enough inputs that are changed from binate to unate by decomposition, or the clauses may be lower ranked than other clause. In FIG. 6B, Clause A is decomposed while Clause B is not.

Figure 6C:
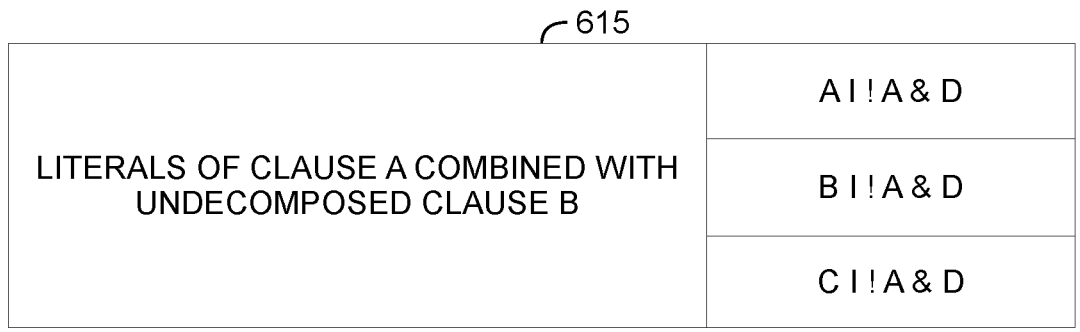

At block 535, the netlist optimizer combines the literals of the decomposed clause with the undecomposed clauses. FIG. 6C illustrates combining the decomposed literals of Clause A with undecomposed Clause B. As shown in chart 615, each literal of decomposed Clause A is combined using OR logic with Clause B. Thus, in this example, performing the method 500 transforms one verification task into three separate verification tasks, each of which may be optimized to a greater degree than the original verification task due to the greater number of unate inputs.

At block 540, the netlist optimization simplifies the netlist by merging the unate inputs to constant values. For example, assuming decomposing Clause A as shown in FIG. 6B changes its inputs from binate inputs to unate inputs, than the inputs A, B, and C in the three verification tasks shown in chart 615 can be merged to constant values. Thus, when verifying the design, the verification application does not need to consider the logic of gates A, B, and C which are replaced by constant values—i.e., a logical one or zero. Because binate inputs in the original SOP representation have been changed into unate inputs, verifying the three SOP representations shown in chart 615 may require less resources without sacrificing accuracy and coverage.

In one embodiment, decomposing the SOP representation is performed recursively. That is, method 500 may again be applied to sub-properties (i.e., the three decomposed SOP representations shown in chart 615) to determine if further decomposition of the sub-properties would provide additional opportunities to merge unate inputs. Moreover, the netlist optimizer may perform other transformations between repetitive uses of method 500 to the properties and sub-properties of a property gate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method comprising:
    identifying a property gate in a netlist, wherein the property gate comprises a logic gate that is monitored to verify proper function of the netlist;
    traversing input paths corresponding to the property gate to identify first and second primary inputs upstream from the property gate;
    identifying respective polarities of the first and second primary inputs by assigning polarity values to logic in the input paths that are between the property gate and the first and second primary inputs, wherein the identified polarities are at least one of a positive value and a negative value;
    characterizing the first primary input as unate and the second primary input as binate based on the identified polarities by:
        upon determining the first primary input is assigned only one of the negative and positive values, determining the first primary input is unate; and
        upon determining the second primary input is assigned both the positive and negative values, determining the second primary input is binate; and
    merging the unate primary input to a constant value in the netlist.

2. The method of claim 1, wherein identifying respective polarities of the first and second primary inputs comprises:
    setting an output of the property gate to a value indicating improper function of the netlist;
    after setting the output, determining a polarity of each input of the property gate that would result in the output of the property gate being at the value indicating improper function of the netlist; and
    traversing each of the input paths until reaching the first and second primary inputs, wherein output values of the first and second primary input are nondeterministic.

3. The method of claim 2, wherein the second primary input is binate because both the positive value and the negative value when outputted by the second primary input can result in the output of the property gate being at the value indicating improper function of the netlist.

4. The method of claim 1, further comprising:
    after merging, performing a verification test on the netlist using the constant value to determine if an input sequence causes the property gate to enter into an error state, and wherein the netlist comprises at least one sequential hardware element.

5. The method of claim 4, wherein the binate primary input is not changed into a constant value when performing the verification test.

6. The method of claim 1, wherein the property gate is one of a liveness property gate, a safety property gate, and a constraint gate.

7. A computer program product for scaling logic verification, the computer program product comprising:
    a computer-readable storage medium having computer-readable program code embodied therewith, the computer-readable program code executable by one or more computer processors to perform an operation comprising:
        identifying a property gate in a netlist, wherein the property gate comprises a logic gate that is monitored to verify proper function of the netlist;
        traversing input paths corresponding to the property gate to identify first and second primary inputs upstream from the property gate;
        identifying respective polarities of the first and second primary inputs by assigning polarity values to logic in the input paths that are between the property gate and the first and second primary inputs, wherein the identified polarities are at least one of a positive value and a negative value;
        characterizing the first primary input as unate and the second primary input as binate based on the identified polarities by:
            upon determining the first primary input is assigned only one of the negative and positive values, determining the first primary input is unate; and
            upon determining the second primary input is assigned both the positive and negative values, determining the second primary input is binate; and
        merging the unate primary input to a constant value in the netlist.

8. The computer program product of claim 7, wherein identifying respective polarities of the first and second primary inputs comprises:
    setting an output of the property gate to a value indicating improper function of the netlist;
    after setting the output, determining a polarity of each input of the property gate that would result in the output of the property gate being at the value indicating improper function of the netlist; and
    traversing each of the input paths until reaching the first and second primary inputs, wherein output values of the first and second primary input are nondeterministic.

9. The computer program product of claim 8, wherein the second primary input is binate because either the positive value or the negative value when outputted by the second primary input can result in the output of the property gate being at the value indicating improper function of the netlist.

10. The computer program product of claim 7, wherein the operation further comprises:
    after merging, performing a verification test on the netlist using the constant value to determine if an input sequence causes the property gate to enter into an error state, and wherein the netlist comprises at least one sequential hardware element.

11. The computer program product of claim 10, wherein the binate primary input is not changed into a constant value when performing the verification test.

12. The computer program product of claim 7, wherein the property gate is one of a liveness property gate, a safety property gate, and a constraint gate.

13. A computing system, comprising:
    a computing processor; and
    a memory comprising a program that when executed by the processor is configured to:
        identify a property gate in a netlist, wherein the property gate comprises a logic gate that is monitored to verify proper function of the netlist,
        traverse input paths corresponding to the property gate to identify first and second primary inputs upstream from the property gate,
        identify respective polarities of the first and second primary inputs by assigning polarity values to logic in the input paths that are between the property gate and the first and second primary inputs, wherein the identified polarities are at least one of a positive value and a negative value,
        characterize the first primary input as unate and the second primary input as binate based on the identified polarities by:

upon determining the first primary input is assigned only one of the negative and positive values, determining the first primary input is unate; and upon determining the second primary input is assigned both the positive and negative values, determining the second primary input is binate, and merge the unate primary input to a constant value in the netlist.

14. The computing system of claim 13, wherein identifying respective polarities of the first and second primary inputs comprises:

setting an output of the property gate to a value indicating improper function of the netlist;

after setting the output, determining a polarity of each input of the property gate that would result in the output of the property gate being at the value indicating improper function of the netlist; and traversing each of the input paths until reaching the first and second primary inputs, wherein output values of the first and second primary input are nondeterministic.

15. The computing system of claim 14, wherein the second primary input is binate because either the positive value or the negative value when outputted by the second primary input can result in the output of the property gate being at the value indicating improper function of the netlist.

16. The computing system of claim 13, wherein the program is configured to:

after merging, perform a verification test on the netlist using the constant value to determine if an input sequence causes the property gate to enter into an error state, and wherein the netlist comprises at least one sequential hardware element.

17. The computing system of claim 16, wherein the binate primary input is not changed into a constant value when performing the verification test.

* * * * *